(12) United States Patent
Oh et al.

(10) Patent No.: US 9,209,363 B2
(45) Date of Patent: Dec. 8, 2015

(54) LIGHT EMITTING DEVICE WITH IMPROVED CURRENT SPREADING PERFORMANCE AND LIGHTING APPARATUS INCLUDING THE SAME

(71) Applicant: LG INNOTEK CO., LTD., Seoul (KR)

(72) Inventors: So Yeong Oh, Seoul (KR); Sung Min Hwang, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 14/308,101

(22) Filed: Jun. 18, 2014

(65) Prior Publication Data

US 2014/0374785 A1      Dec. 25, 2014

(30) Foreign Application Priority Data

Jun. 19, 2013   (KR) .................. 10-2013-0070104

(51) Int. Cl.
| | |
|---|---|
| H01L 33/00 | (2010.01) |
| H01L 33/42 | (2010.01) |
| H01L 33/38 | (2010.01) |
| H01L 33/28 | (2010.01) |
| H01L 33/32 | (2010.01) |
| H01L 33/60 | (2010.01) |
| H01L 33/44 | (2010.01) |

(52) U.S. Cl.
CPC ............ *H01L 33/42* (2013.01); *H01L 33/28* (2013.01); *H01L 33/32* (2013.01); *H01L 33/38* (2013.01); *H01L 33/60* (2013.01); *H01L 33/44* (2013.01)

(58) Field of Classification Search
CPC ....... H01L 33/387; H01L 33/36; H01L 33/38; H01L 33/382
See application file for complete search history.

(56) References Cited

U.S. PATENT DOCUMENTS

| | | | |
|---|---|---|---|
| 6,518,598 B1 * | 2/2003 | Chen .............................. | 257/91 |
| 2004/0012030 A1 * | 1/2004 | Chen et al. ..................... | 257/99 |
| 2004/0256631 A1 | 12/2004 | Shin | |

(Continued)

FOREIGN PATENT DOCUMENTS

| | | |
|---|---|---|
| DE | 10 2007 046 743 A1 | 4/2009 |
| EP | 1 553 640 A1 | 7/2005 |

(Continued)

*Primary Examiner* — Bilkis Jahan
(74) *Attorney, Agent, or Firm* — Birch, Stewart, Kolasch & Birch, LLP (57) ABSTRACT

Disclosed herein is a light emitting device exhibiting improved current spreading. The disclosed light emitting device includes a light emitting structure including a first conductivity type semiconductor layer, a second conductivity type semiconductor layer, and an active layer disposed between the first conductivity type and second conductivity type semiconductor layers, a first electrode disposed on the first conductivity type semiconductor layer, and a second electrode disposed on the second conductivity type semiconductor layer. The light emitting structure includes a mesa etching region where the second conductivity type semiconductor layer, active layer, and first conductivity type semiconductor layer are partially etched, thereby exposing a portion of the first conductivity type semiconductor layer. The first electrode is disposed on the exposed portion of the first conductivity type semiconductor layer. A first electrode layer is disposed between the second conductivity type semiconductor layer and the second electrode. A second electrode layer is disposed between portions of the first electrode layer spaced from each other at opposite sides of the mesa etching region.

10 Claims, 6 Drawing Sheets

(56) References Cited

U.S. PATENT DOCUMENTS

| | | |
|---|---|---|
| 2006/0124954 A1 | 6/2006 | Akaishi |
| 2006/0163604 A1* | 7/2006 | Shin et al. ............ 257/103 |
| 2009/0039359 A1* | 2/2009 | Yoon et al. ............ 257/88 |
| 2010/0148185 A1 | 6/2010 | Hsu |
| 2010/0155752 A1* | 6/2010 | Lim et al. ............ 257/94 |
| 2010/0187559 A1* | 7/2010 | Han ............ 257/99 |
| 2011/0260205 A1* | 10/2011 | Moosburger et al. ............ 257/99 |
| 2012/0001538 A1* | 1/2012 | Kim ............ 313/512 |

FOREIGN PATENT DOCUMENTS

| | | |
|---|---|---|
| EP | 2 207 211 A1 | 7/2010 |
| EP | 2 369 646 A1 | 9/2011 |
| EP | 2 375 459 A1 | 10/2011 |
| JP | 6-296041 A | 10/1994 |
| JP | 2013-48200 A | 3/2013 |

* cited by examiner

LIGHT EMITTING DEVICE WITH IMPROVED CURRENT SPREADING PERFORMANCE AND LIGHTING APPARATUS INCLUDING THE SAME

CROSS REFERENCE TO RELATED APPLICATION

This application claims priority under 35 U.S.C. §119 to Korean Application No. 10-2013-0070104, filed in Korea on Jun. 19, 2013, which is hereby incorporated in its entirety by reference as if fully set forth herein.

TECHNICAL FIELD

Embodiments relate to a light emitting device and a lighting apparatus including the same.

BACKGROUND

Light emitting devices, such as light emitting diodes (LEDs) and laser diodes, which use a Group III-V or Group II-VI compound semiconductor material, may render various colors such as red, green, blue, and ultraviolet by virtue of development of thin film growth technologies and device materials. It may also be possible to produce white light at high efficiency using fluorescent materials or through color mixing. Further, the light emitting devices have advantages, such as low power consumption, semi-permanent lifespan, fast response time, safety, and environmental friendliness as compared to conventional light sources, such as fluorescent lamps and incandescent lamps.

Therefore, these light emitting devices are increasingly applied to transmission modules of optical communication units, light emitting diode backlights as a replacement for cold cathode fluorescent lamps (CCFLs) constituting backlights of liquid crystal display (LCD) devices, and lighting apparatuses using white light emitting diodes as a replacement for fluorescent lamps or incandescent lamps, headlights for vehicles and traffic lights.

Figure 1:
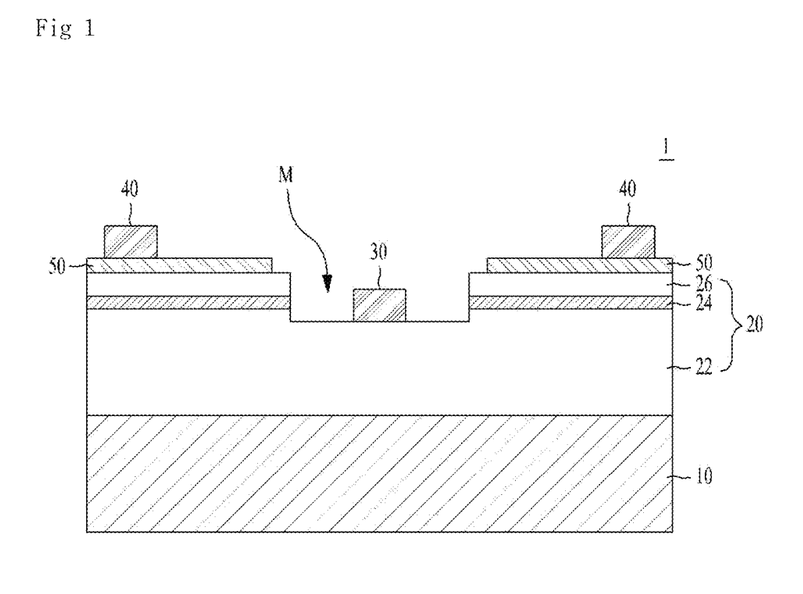
FIG. 1 is a cross-sectional view of a conventional light emitting device.
Figure 2:
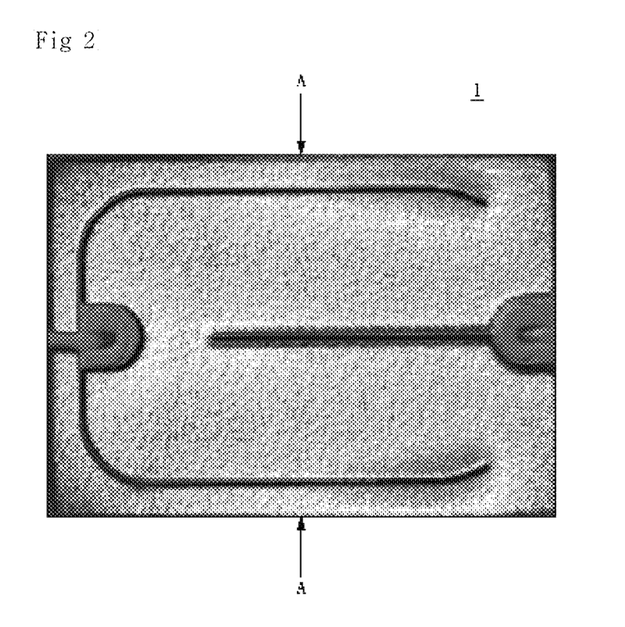
FIG. 2 is a top image view illustrating current spreading of the light emitting device in FIG. 1.

FIG. 1 is a cross-sectional view of a conventional light emitting device. FIG. 2 is a top image view illustrating current spreading of the light emitting device in FIG. 1. FIG. 1 illustrates a cross-sectional view taken along line A-A of FIG. 2.

Referring to FIG. 1, the conventional light emitting device, which is designated by reference numeral "1", includes a substrate 10, and a light emitting structure 20 disposed on the substrate 10. The light emitting structure 20 includes a first conductivity type semiconductor layer 22, an active layer 24, and a second conductivity type semiconductor layer 26. The light emitting structure 20 has a mesa etching region M where portions of the second conductivity type semiconductor layer 26, active layer 24, and first conductivity type semiconductor layer 22 are removed through etching.

A first electrode 30 is disposed on a portion of the first conductivity type semiconductor layer 22 exposed through the etching region M. A second electrode 40 is disposed on an unetched portion of the second conductivity type semiconductor layer 26. A transparent electrode layer 50 is disposed between the second conductivity type semiconductor layer 26 and the second electrode 40.

However, the conventional light emitting device 1 may have a following problem.

Referring to FIG. 2, current from the second conductivity type semiconductor layer 26 flows while bypassing the mesa etching region M because the transparent electrode layer 50 is not present in the mesa etching region M. As a result, current spreading is ineffective and, as such, there may be a phenomenon in which current is concentrated around the second electrode 40.

SUMMARY

Embodiments provide a light emitting device exhibiting improved current spreading and a lighting apparatus including the same.

In an embodiment, a light emitting device includes a light emitting structure including a first conductivity type semiconductor layer, a second conductivity type semiconductor layer, and an active layer disposed between the first conductivity type semiconductor layer and the second conductivity type semiconductor layer, a first electrode disposed on the first conductivity type semiconductor layer, and a second electrode disposed on the second conductivity type semiconductor layer, wherein the light emitting structure includes a mesa etching region where the second conductivity type semiconductor layer, the active layer, and the first conductivity type semiconductor layer are partially etched, thereby exposing a portion of the first conductivity type semiconductor layer, and the first electrode is disposed on the exposed portion of the first conductivity type semiconductor layer in the mesa etching region, wherein a first electrode layer is disposed between the second conductivity type semiconductor layer and the second electrode, and a second electrode layer is disposed between portions of the first electrode layer spaced from each other at opposite sides of the mesa etching region.

Each of the first electrode layer and the second electrode layer may be a transparent electrode layer.

The second electrode layer may overlap, at opposite ends thereof, the first electrode layer.

The second electrode layer may overlap a portion of the mesa etching region.

The first electrode may be disposed beneath the second electrode layer.

An insulating layer may be disposed between the mesa etching region and the second electrode layer.

The insulating layer may be disposed inside a portion of the light emitting structure exposed through the mesa etching region.

An empty space may be present between the second electrode layer and the first electrode.

The insulating layer may fill the space between the second electrode layer and the first electrode.

The second electrode layer may contact the first electrode layer, and may have a higher level than the first electrode layer at a location where the second electrode layer contacts the first electrode layer.

The second electrode layer may be thicker than the first electrode layer.

The insulating layer may enclose the first electrode.

In another embodiment, a light emitting device includes a light emitting structure including a first conductivity type semiconductor layer, a second conductivity type semiconductor layer, and an active layer disposed between the first conductivity type semiconductor layer and the second conductivity type semiconductor layer, a first electrode disposed on the first conductivity type semiconductor layer, and a second electrode disposed on the second conductivity type semiconductor layer, wherein the light emitting structure includes a mesa etching region where the second conductivity type semiconductor layer, the active layer, and the first conductivity type semiconductor layer are partially etched, thereby exposing a portion of the first conductivity type semiconductor layer, and the first electrode is disposed on the exposed portion of the first conductivity type semiconductor layer in the mesa etching region, wherein a first electrode layer is disposed between the second conductivity type semiconductor layer and the second electrode, and a plurality of second electrode layer units is disposed between portions of the first electrode layer spaced from each other at opposite sides of the mesa etching region.

Each of the first electrode layer and the second electrode layer may be a transparent electrode layer. Adjacent ones of the second electrode layer units may have a non-uniform spacing.

The spacing between the second electrode layer units may be gradually reduced in a direction from a pad portion of the second electrode to an end portion of the second electrode.

The second electrode layer units may be gradually increased in number in a direction from a pad portion of the second electrode to an end portion of the second electrode.

The second electrode units may have non-uniform widths, respectively. The widths of the second electrode layer units may be gradually increased in a direction from a pad portion of the second electrode to an end portion of the second electrode.

An insulating layer may be disposed between the mesa etching region and the second electrode layer.

The insulating layer may be disposed inside a portion of the light emitting structure exposed through the mesa etching region.

The insulating layer may fill a space between the second electrode layer and the first electrode.

In another embodiment, a lighting apparatus includes a light source module including the light emitting device according to one of the above-described embodiments, a reflection plate disposed on a bottom cover, a light guide plate disposed on the reflection plate, and an optical sheet disposed on the light guide plate.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thickness or size of each layer is exaggerated, omitted, or schematically illustrated for convenience of description and clarity. In addition, the size or area of each constituent element does not entirely reflect the actual size thereof.

Figure 3:
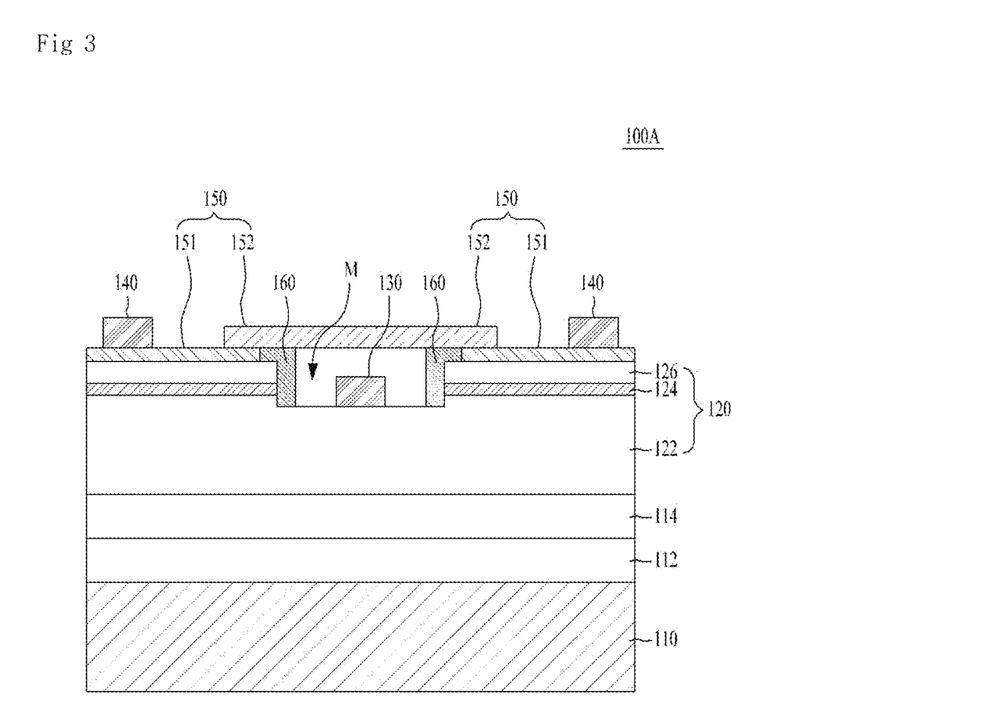
FIG. 3 is a cross-sectional view of a light emitting device according to a first embodiment.
Figure 4:
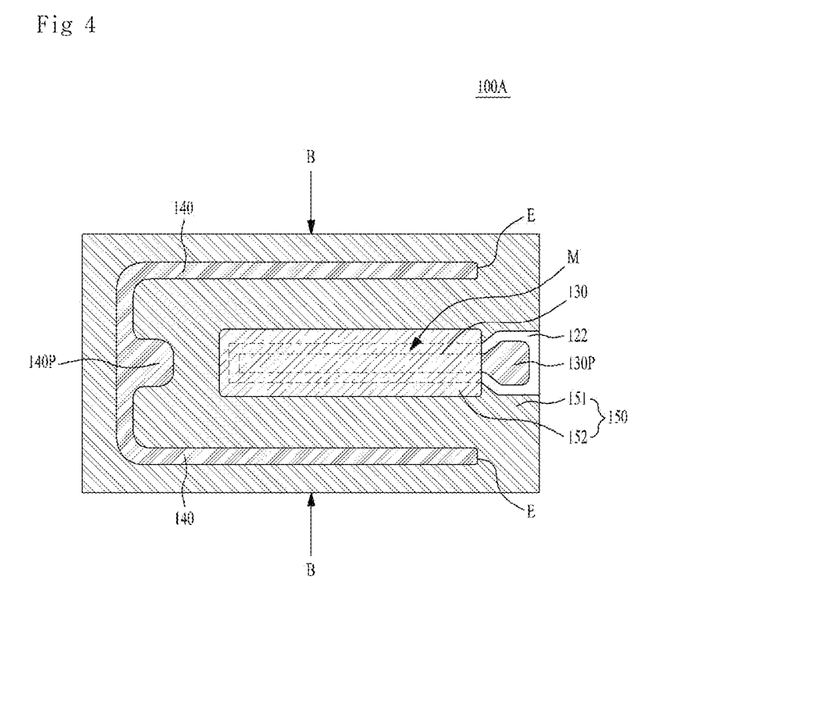
FIG. 4 is a plan view of the light emitting device according to the first embodiment.

FIG. 3 is a cross-sectional view of a light emitting device according to a first embodiment. FIG. 4 is a plan view of the light emitting device according to the first embodiment. FIG. 3 illustrates a cross-sectional view taken along line B-B of FIG. 4.

Referring to FIGS. 3 and 4, the light emitting device according to the first embodiment, which is designated by reference numeral "100A", may include a substrate 110, and a light emitting structure 120 disposed on the substrate 110.

The light emitting device 100A includes a light emitting diode (LED) using a plurality of compound semiconductor layers, for example, semiconductor layers of Group III-V or Group II-VI elements. The LED may be a colored LED to emit blue, green, or red light, a white LED, or an ultraviolet (UV) LED. Light emitted from the LED may be diversified through variation of kinds and concentrations of materials constituting the semiconductor layers, although the present disclosure is not limited thereto.

The light emitting structure 120 includes a first conductivity type semiconductor layer 122, an active layer 124, and a second conductivity type semiconductor layer 126.

The light emitting structure 120 may be formed using, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like. Of course, the formation method is not limited to the above-described methods.

The first conductivity type semiconductor layer 122 may be made of a semiconductor compound, for example, a Group III-V or Group II-VI compound semiconductor. The first conductivity type semiconductor layer 122 may be doped with a first conductivity type dopant. When the first conductivity type semiconductor layer 122 is an n-type semiconductor layer, the first conductivity type dopant is an n-type dopant. The n-type dopant may include Si, Ge, Sn, Se, Te, or the like, although the present disclosure is not limited thereto. When the first conductivity type semiconductor layer 122 is a p-type semiconductor layer, the first conductivity type dopant is a p-type dopant. The p-type dopant may include Mg, Zn, Ca, Sr, Ba, or the like, although the present disclosure is not limited thereto.

The first conductivity type semiconductor layer 122 may include a semiconductor material having a formula of $Al_xIn_yGa_{1-x-y}N$ ($0 \le x \le 1$, $0 \le y \le 1$, and $0 \le x+y \le 1$). The first conductivity type semiconductor layer 122 may include at least one element of Ga, N, In, Al, As, and P. The first conductivity type semiconductor layer 122 may be made of at least one of GaN, InN, AlN, InGaN, AlGaN, InAlGaN, AlInN, AlGaAs, InGaAs, AlInGaAs, GaP, AlGaP, InGaP, AlInGaP, and InP.

The second conductivity type semiconductor layer 126 may be made of a semiconductor compound, for example, a Group III-V or Group II-VI compound semiconductor. The second conductivity type semiconductor layer 126 may be doped with a second conductivity type dopant. When the second conductivity type semiconductor layer 126 is a p-type semiconductor layer, the second conductivity type dopant is a p-type dopant. The p-type dopant may include Mg, Zn, Ca, Sr, Ba, or the like, although the present disclosure is not limited thereto. When the second conductivity type semiconductor layer 126 is an n-type semiconductor layer, the second conductivity type dopant is an n-type dopant. The n-type dopant may include Si, Ge, Sn, Se, Te, or the like, although the present disclosure is not limited thereto.

The second conductivity type semiconductor layer 126 may include a semiconductor material having a formula of $Al_xIn_yGa_{1-x-y}N$ ($0 \leq x \leq 1$, $0 \leq y \leq 1$, $0 \leq x+y \leq 1$). The second conductivity type semiconductor layer 126 may include at least one element of Ga, N, In, Al, As, and P. The second conductivity type semiconductor layer 126 may be made of at least one of GaN, InN, AlN, InGaN, AlGaN, InAlGaN, AlInN, AlGaAs, InGaAs, AlInGaAs, GaP, AlGaP, InGaP, AlInGaP, and InP.

The following description will be given in conjunction with an example in which the first conductivity type semiconductor layer 122 is an n-type semiconductor layer, and the second conductivity type semiconductor layer 126 is a p-type semiconductor layer.

Over the second conductivity type semiconductor layer 126, a semiconductor layer having an opposite polarity to the second conductivity type may be formed. For example, when the second conductivity type semiconductor layer 126 is a p-type semiconductor layer, an n-type semiconductor layer (not shown) may be formed over the second conductivity type semiconductor layer 126. Thus, the light emitting structure 120 may be implemented as one of an n-p junction structure, a p-n junction structure, an n-p-n junction structure, and a p-n-p junction structure.

The active layer 124 is disposed between the first conductivity type semiconductor layer 122 and the second conductivity type semiconductor layer 126.

In the active layer 124, electrons and holes meet and, as such, emit light with energy determined by the intrinsic energy band of the material of the active layer 124 (light emitting layer). When the first conductivity type semiconductor layer 122 is an n-type semiconductor layer, and the second conductivity type semiconductor layer 126 is a p-type semiconductor layer, electrons may be injected from the first conductivity type semiconductor layer 122 into the active layer 124, and holes may be injected from the second conductivity type semiconductor layer 126 into the active layer 124.

The active layer 124 may have at least one of a single quantum well structure, a multi quantum well structure, a quantum wire structure, and a quantum dot structure. For example, the active layer 124 may have a multi quantum well structure through injection of tri-methyl gallium gas (TMGa), ammonia gas ($NH_3$), nitrogen gas ($N_2$), and tri-methyl indium gas (TMIn), although the present disclosure is not limited thereto.

When the active layer 124 has a multi quantum well structure, the active layer 124 may have well and barrier layers having at least one of layer pair structures of InGaN/GaN, InGaN/InGaN, GaN/AlGaN, InAlGaN/GaN, GaAs(InGaAs)/AlGaAs, and GaP(InGaP)/AlGaP, although the present disclosure is not limited thereto. The well layer may be made of a material having a lower band gap than the barrier layer.

The light emitting structure 120 is supported by the substrate 110 disposed beneath the light emitting structure 120.

The substrate 110 may be formed using a material suitable for growth of a semiconductor material or a material having excellent thermal conductivity. The substrate 110 may be made of at least one of sapphire ($Al_2O_3$), SiC, GaAs, GaN, ZnO, Si, GaP, InP, Ge, and $Ga_2O_3$. Wet washing or plasma treatment may be performed upon the substrate 110, to remove impurities from the surface of the substrate 110.

A buffer layer 112 may be disposed between the light emitting structure 120 and the substrate 110. The buffer layer is adapted to reduce lattice mismatch and thermal expansion coefficient difference between the material of the substrate 110 and the material of the light emitting structure 120. The buffer layer may be made of a Group III-V or Group II-VI compound semiconductor, for example, at least one of GaN, InN, AlN, InGaN, AlGaN, InAlGaN, and AlInN.

An undoped semiconductor layer 114 may be disposed between the substrate 110 and the first conductivity type semiconductor layer 122. The undoped semiconductor layer 114 is a layer formed to achieve an enhancement in crystallinity of the first conductivity type semiconductor layer 122. The undoped semiconductor layer 114 may be made of a material identical to or different from the material of the first semiconductor layer 122. The undoped semiconductor layer 114 exhibits lower electric conductivity than the first conductivity type semiconductor layer 122 because no first conductivity type dopant is doped therein. The undoped semiconductor layer 114 may be disposed over the buffer layer 112 while contacting the first conductivity type semiconductor layer 122. The undoped semiconductor layer 112 is grown at a temperature higher than the growth temperature of the buffer layer 112. The undoped semiconductor layer 112 exhibits higher crystallinity than the buffer layer 112.

The light emitting structure 120 includes a mesa etching region M where portions of the second conductivity type semiconductor layer 126, active layer 124, and first conductivity type semiconductor layer 122 are removed through etching. Through the mesa etching region M, the first conductivity type semiconductor layer 122 is partially exposed.

A first electrode 130 is disposed on the first conductivity type semiconductor layer 122. A second electrode 140 is disposed on the second conductivity type semiconductor layer 126. In detail, the first electrode 130 is disposed on the portion of the first conductivity type semiconductor layer 122 exposed through the mesa etching region M. The second electrode 140 is disposed on an unetched portion of the second conductivity type semiconductor layer 126.

The first electrode layer 130 may include at least one of Mo, Cr, Ni, Au, Al, Ti, Pt, V, W, Pd, Cu, Rh, and Ir. The first electrode layer 120 may be formed to have a single layer structure or a multilayer structure.

Referring to FIG. 4, the first electrode 130 and second electrode 140 may include first and second electrode pad portions 130P and 140P having relatively large widths, respectively. The first and second electrode pad portions 130P and 140P may be areas to which wires (not shown) will be bonded for supply of current to the light emitting device 100A.

An electrode layer 150 is disposed over the light emitting structure 120. The electrode layer 150 may be a transparent electrode layer. The electrode layer 150 may be disposed over the second conductivity type semiconductor layer 126 while covering at least a portion of the mesa etching region M.

Since the second conductivity type semiconductor layer 126 may exhibit inferior ohmic characteristics with respect to the second electrode 140, the electrode layer 150 is adapted to improve such electrical characteristics. The electrode layer 150 may have a layer structure or a multi pattern structure.

For the electrode layer 150, a transparent conductive layer or a metal may be selectively used. For example, the electrode layer 150 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—GaZnO (AGZO), In—GaZnO (IGZO), ZnO, $IrO_x$, $RuO_x$, NiO, $RuO_x$/ITO, $Ni/IrO_x/Au$, $Ni/IrO_x/Au/ITO$, Ag, Ni, Cr, Ti, Al, Rh, Pd, Ir, Sn, In, Ru, Mg, Zn, Pt, Au, and Hf, although the present disclosure is not limited thereto.

The electrode layer 150 includes a first electrode layer 151 disposed between the second conductivity type semiconductor layer 126 and the second electrode 140, and a second electrode layer 152 disposed between portions of the first electrode layer 151 spaced from each other at opposite sides of the mesa etching region M.

The first electrode layer 151 is disposed on the unetched portion of the second conductivity type semiconductor layer 126. The second electrode layer 152 is disposed to correspond to the mesa etching region M. The second electrode layer 152 may connect the portions of the first electrode layer 151 spaced by the mesa etching region M.

In accordance with an embodiment, a transparent electrode layer may also be disposed in the mesa etching region M, not only to uniformly spread current injected from the second electrode 140 over the light emitting structure 120, but also to reduce a phenomenon in which current is concentrated around the second electrode 140. As current is spread up to the mesa etching region M, an enhancement in light amount of the light emitting device 100A and an improvement in operating voltage of the light emitting device 100A may be achieved.

The second electrode layer 152 contacts, at opposite ends thereof, the first electrode layer 151. In an embodiment, opposite ends of the second electrode layer 152 may overlap the first electrode layer 151. In this case, there may be a seep at a location where the first electrode layer 151 and second electrode layer 152 contact. That is, the second electrode layer 152 has a higher level than the first electrode layer 151 at the location where the first electrode layer 151 and second electrode layer 152 contact.

The second electrode layer 152 may be thicker than the first electrode layer 151. The second electrode layer 152 is arranged to correspond to the mesa etching region M, which is a non-emission region, and, as such, there is no possibility of light absorption by the second electrode layer 152. Accordingly, it may be possible to maximize current spreading effects by forming the second electrode layer 152 to be thicker than the first electrode layer 151.

Since the second electrode layer 152 is arranged to correspond to the mesa etching region M, the first electrode 130 is disposed beneath the second electrode layer 152.

The second electrode layer 152 covers at least a portion of the mesa etching region M. The position and size of the second electrode layer 152 covering the mesa etching region M may be varied in accordance with embodiments, so long as the second electrode layer 152 connects the portions of the first electrode layer 151 spaced by the mesa etching region M. In FIG. 4, the second electrode layer 152 is illustrated as not being disposed over the first electrode pad portion 130P. Of course, the present disclosure is not limited to the illustrated case. The second electrode layer 152 may be arranged to completely cover the mesa etching region M or to partially cover the mesa etching region M. That is, the second electrode layer 152 may overlap a portion of the mesa etching region M.

Referring to FIG. 3, an insulating layer 160 may be disposed beneath the second electrode layer 152 in the mesa etching region M. The insulating layer 160 may also be disposed on an upper surface of the light emitting structure 120 in a region where the first electrode layer 151 is not disposed. The insulating layer 160 may protect side walls of the light emitting structure 120 exposed through etching while preventing electrical short circuit between the active layer 124 and the second electrode layer 152 or between the first conductivity type semiconductor layer 122 and the second electrode layer 152. The insulating layer 160 may be disposed at the side walls of the light emitting structure 120 exposed through mesa etching in the mesa etching region M. The insulating layer 160 may function to support the second electrode layer 152.

The insulating layer 160 may be made of a non-conductive oxide or nitride. For example, the insulating layer 160 may include a silicon oxide ($SiO_2$) layer, an oxide nitride layer, or an aluminum oxide layer, although the present disclosure is not limited thereto.

An empty space may be present between the second electrode layer 152 and the first electrode 130. The second electrode layer 152 may take the form of an air bridge.

Figure 5:
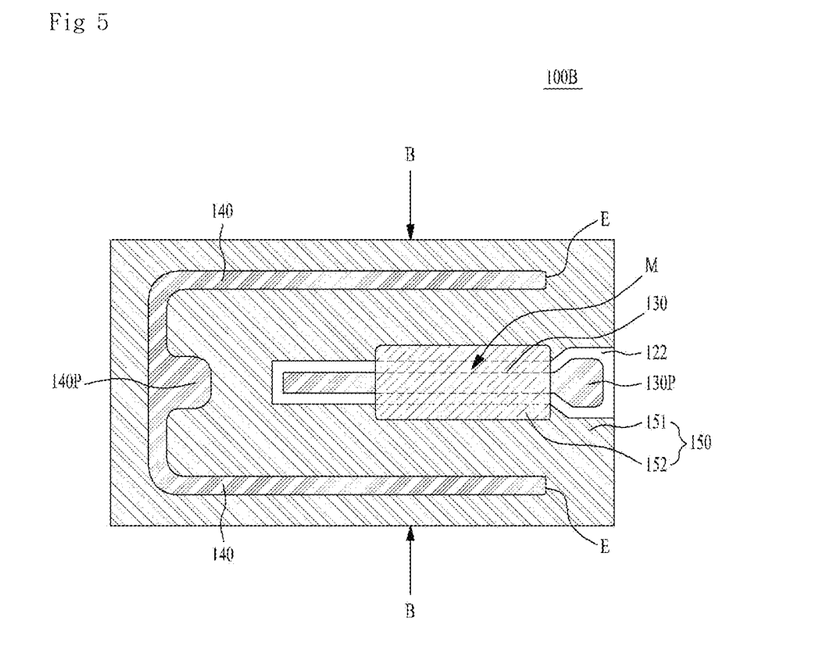
FIG. 5 is a plan view of a light emitting device according to a second embodiment.

FIG. 5 is a plan view of a light emitting device according to a second embodiment. The cross-sectional view of the light emitting element of FIG. 5 taken along line B-B of FIG. 5 is identical to FIG. 3 and, as such, is not again shown and refers to FIG. 3. The content of this embodiment repeating that of the previous embodiment will be no longer described and, as such, a description will be given only in conjunction with the differences of the embodiments.

Referring to FIG. 5, the light emitting device according to the second embodiment, which is designated by reference numeral "100B", is different from the light emitting device 100A according to the first embodiment in that the second electrode layer 152 is disposed in the mesa etching region M toward an end portion E of the second electrode 140. That is, the mesa etching region M is exposed in a region adjacent to the second electrode pad portion 140P, and the second electrode 152 is disposed toward the end portion E of the second electrode 140.

In the conventional light emitting device, a phenomenon in which current is concentrated occurs because current injected through the second electrode 140 flows while bypassing the mesa etching region M and, as such, smooth flow of current is not exhibited at the end portion E of the second electrode 140. In accordance with this embodiment, however, the second electrode layer 152 is disposed in the mesa etching region M toward the end portion E of the second electrode 140 and, as such, current may flow through the second electrode layer 152 before bypassing the mesa etching region M. Accordingly, smooth flow of current may be achieved.

Figure 6:
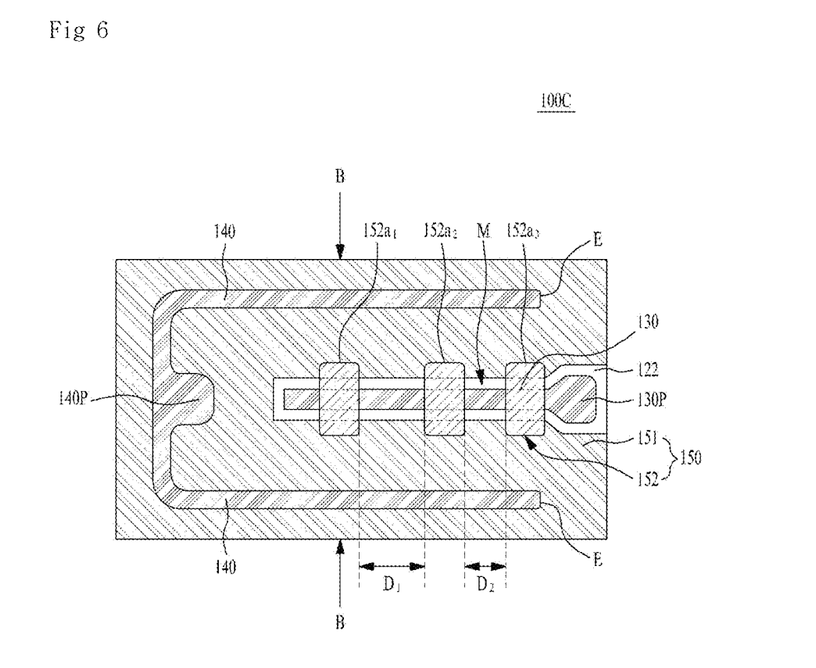
FIG. 6 is a plan view of a light emitting device according to a third embodiment.

FIG. 6 is a plan view of a light emitting device according to a third embodiment. The cross-sectional view of the light emitting element of FIG. 6 taken along line B-B of FIG. 6 is identical to FIG. 3 and, as such, is not again shown and refers to FIG. 3. The content of this embodiment repeating those of the previous embodiments will be no longer described and, as such, a description will be given only in conjunction with the differences of the embodiments.

Referring to FIG. 6, in the light emitting device according to the third embodiment, which is designated by reference numeral "100C", the second electrode layer 152 may include a plurality of spaced second electrode layer units 152a. Although three second electrode layer units $152a_1$, $152a_2$, and $152a_3$ are illustrated in FIG. 6, the number of second electrode layer units 152a may be varied in accordance with embodiments.

Adjacent ones of the plural second electrode layer units 152a may be non-uniform. For example, referring to FIG. 6, the spacing between the second electrode layer unit $152a_1$ disposed at the leftmost and the second electrode layer unit $152a_2$ disposed at the middle, namely, a spacing $D_1$ differs from the spacing between the second electrode layer unit $152a_2$ disposed at the middle and the second electrode layer unit $152a_3$ disposed at the rightmost, namely, a spacing $D_2$.

In accordance with an embodiment, the spacing between the adjacent two second electrode layer units 152a may be gradually reduced in a direction from the pad portion 140P of the second electrode 140 to the end portion E of the second electrode 140 ($D_1 > D_2$). That is, the number of second electrode layer units 152a may be gradually increased in the mesa etching region M in a direction toward the end portion E of the second electrode 140.

In the conventional light emitting device, a phenomenon in which current is concentrated occurs because current injected through the second electrode 140 flows while bypassing the mesa etching region M and, as such, smooth flow of current is not exhibited at the end portion E of the second electrode 140. In accordance with this embodiment, however, a plurality of second electrode layer units 152a is disposed in the mesa etching region M toward the end portion E of the second electrode 140 and, as such, smooth flow of current may be achieved.

Figure 7:
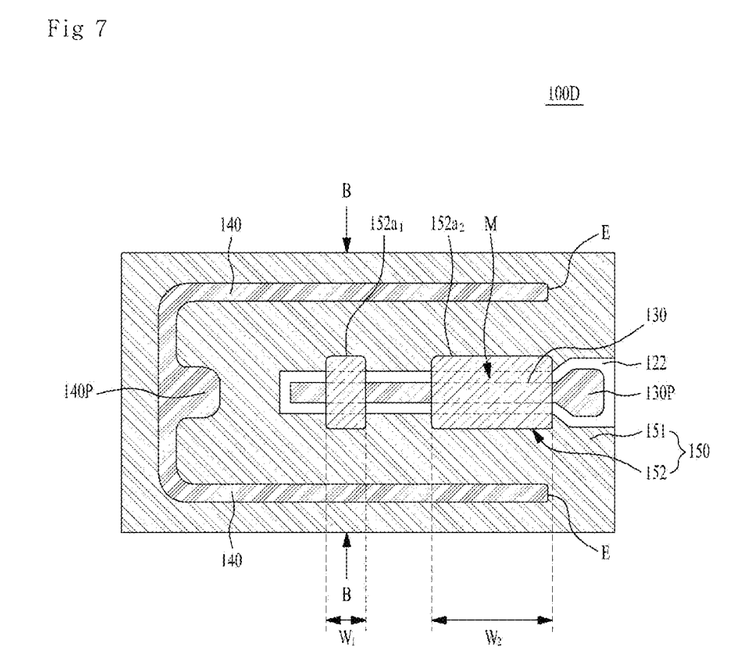
FIG. 7 is a plan view of a light emitting device according to a fourth embodiment.

FIG. 7 is a plan view of a light emitting device according to a fourth embodiment. The cross-sectional view of the light emitting element of FIG. 7 taken along line B-B of FIG. 6 is identical to FIG. 3 and, as such, is not again shown and refers to FIG. 3. The content of this embodiment repeating those of the previous embodiments will be no longer described and, as such, a description will be given only in conjunction with the differences of the embodiments.

Referring to FIG. 7, in the light emitting device according to the fourth embodiment, which is designated by reference numeral "100D", the second electrode layer 152 may include a plurality of spaced second electrode layer units 152a. Although two second electrode layer units $152a_1$ and $152a_2$ are illustrated in FIG. 7, the number of second electrode layer units 152a may be varied in accordance with embodiments.

The plural second electrode layer units 152a may have a non-uniform width. The width of each second electrode layer unit 152a means a width in a direction perpendicular to a longitudinal direction of the mesa etching region M. For example, referring to FIG. 7, the width of the second electrode layer unit $152a_1$ disposed at the left side, namely, a width $W_1$ differs from the width of the second electrode layer unit $152a_2$ disposed at the right side, namely, a width $W_2$.

In accordance with an embodiment, the widths of the plural second electrode layer units 152a may be gradually increased in a direction from the pad portion 140P of the second electrode 140 to the end portion E of the second electrode 140 ($W_1 < W_2$).

In the conventional light emitting device, a phenomenon in which current is concentrated occurs because current injected through the second electrode 140 flows while bypassing the mesa etching region M and, as such, smooth flow of current is not exhibited at the end portion E of the second electrode 140. In accordance with this embodiment, however, the widths of the plural second electrode layer units 152a may be gradually increased in a direction toward the end portion E of the second electrode 140 and, as such, smooth flow of current may be achieved.

Figure 8:
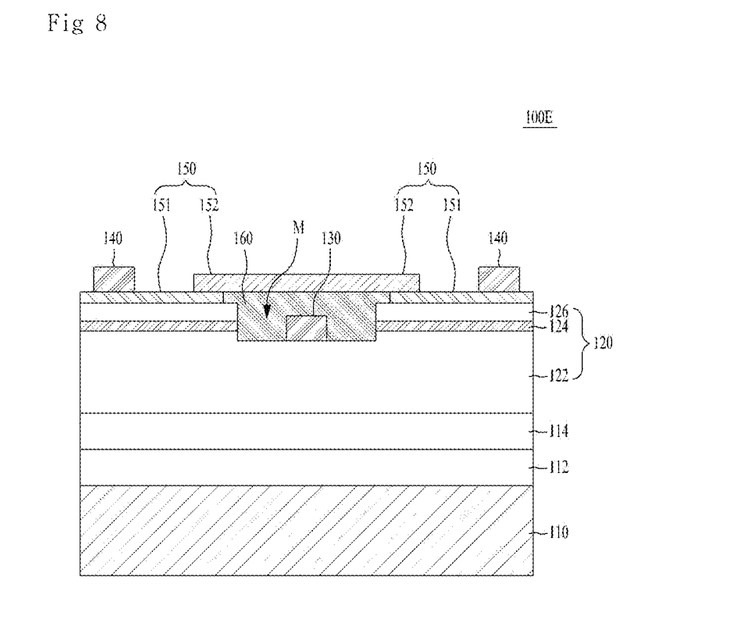
FIG. 8 is a cross-sectional view of a light emitting device according to a fifth embodiment.

FIG. 8 is a cross-sectional view of a light emitting device according to a fifth embodiment. The content of this embodiment repeating those of the previous embodiments will be no longer described and, as such, a description will be given only in conjunction with the differences of the embodiments.

Referring to FIG. 8, in the light emitting device according to the fifth embodiment, which is designated by reference numeral "100E", an insulating layer 160 may be disposed in the mesa etching region M. In addition, the insulating layer 160 may be disposed between the light emitting structure 120 and the second electrode layer 152. The insulating layer 160 may protect side walls of the light emitting structure 120 exposed through etching and the first electrode 130 while preventing electrical short circuit between the active layer 124 or the first conductivity type semiconductor layer 122 and the second electrode layer 152. The insulating layer 160 may be disposed not only at the side walls of the light emitting structure 120 exposed through mesa etching, but also between the second electrode layer 152 and the first electrode 130. That is, the insulating layer 160 may be disposed to enclose the first electrode 130 beneath the second electrode layer 152.

In the fifth embodiment, the insulating layer 160 may function to more firmly support the second electrode layer 152 by filling a space between the second electrode layer 152 and the first electrode 130.

The plan view of the light emitting device 100E according to the fifth embodiment may be similar to FIGS. 4 to 7. Variations of the second electrode layer 152 described with reference to FIGS. 4 to 7 may also be applied to the fifth embodiment. No description will be given of such variations.

Figure 9:
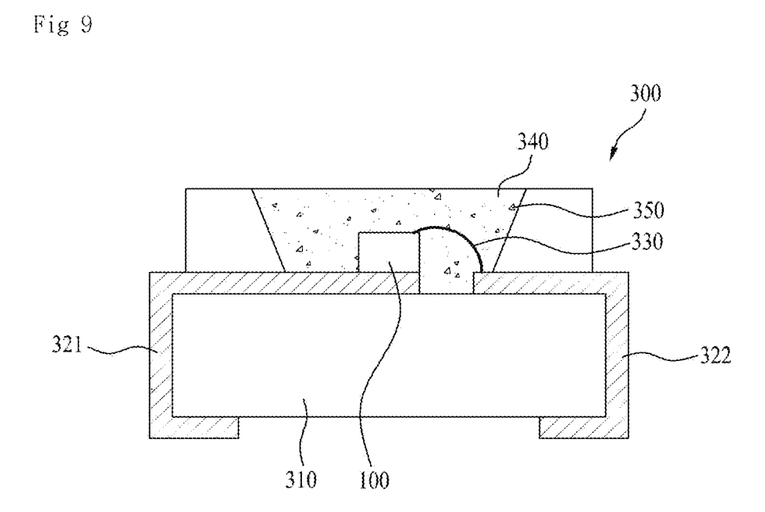
FIG. 9 is a view illustrating a light emitting device package according to an embodiment including one of the light emitting devices according to the above-described embodiments.

FIG. 9 is a view illustrating a light emitting device package according to an embodiment including one of the light emitting devices according to the above-described embodiments.

The light emitting device package according to this embodiment, which is designated by reference numeral "300", includes a body 310, first and second lead frames 321 and 322 disposed at the body 310, the light emitting device 100 according to one of the above-described embodiments, which is disposed at the body 300, to be electrically connected to the first and second lead frames 321 and 322, and a mold 340 formed in a cavity, which may be formed at the body 310. As described above, the light emitting device 100 has a single chip structure including a plurality of light emitting cells connected in series or in parallel.

The body 310 may be made of a silicon material, a synthetic resin material, or a metal material. When the body 310 is made of a conductive material such as a metal material, an insulating layer may be coated over the surface of the body 310, although not shown, in order to avoid electrical short circuit between the first and second lead frames 321 and 322 and the metal body. Accordingly, it may be possible to avoid electrical short circuit between the first lead frame 321 and the second lead frame 322.

The first and second lead frames 321 and 322 are electrically isolated from each other, and supply current to the light emitting device 100. The first and second lead frames 321 and 322 may also reflect light generated from the light emitting device 100 so as to achieve an enhancement in luminous efficacy. In addition, the first and second lead frames 321 and 322 may function to outwardly dissipate heat generated from the light emitting device 100.

The light emitting device 100 may be mounted on the body 310 or on the first lead frame 321 or second lead frame 322. In this embodiment, the light emitting device 100 is directly electrically connected to the first lead frame 321 while being connected to the second lead frame 322 via a wire 330. The light emitting device 100 may be electrically connected to the lead frames 321 and 322, using a flip-chip method or a die-bonding method, in place of the wire-bonding method.

The mold 340 may encapsulate the light emitting device 100, to protect the light emitting device 100. The mold 340 may include phosphors 350, to change the wavelength of light emitted from the light emitting device 100.

The phosphors 350 may include garnet-based phosphors, silicate-based phosphors, nitride-based phosphors, or oxynitride-based phosphors.

For example, the garnet-based phosphors may be YAG ($Y_3Al_5O_{12}$:$Ce^{3+}$) or TAG ($Tb_3Al_5O_{12}$:$Ce^{3+}$). The silicate-based phosphors may be $(Sr,Ba,Mg,Ca)_2SiO_4$:$Eu^{2+}$. The nitride-based phosphors may be $CaAlSiN_3$:$Eu^{2+}$ containing SiN. The oxynitride-based phosphors may be $Si_{6-x}Al_xO_xN_{8-x}$:$Eu^{2+}$ ($0<x<6$).

Light of a first wavelength range emitted from the light emitting device 100 is excited by the phosphors 350 and, as such, is changed into light of a second wavelength range. As the light of the second wavelength range passes through a lens (not shown), the optical path thereof may be changed.

A plurality of light emitting device packages, each of which has the above-described structure according to the illustrated embodiment, is prepared, and is then arrayed on a substrate. Optical members, namely, light guide plates, prism sheets, diffusion sheets, etc., may be arranged on optical paths of the light emitting device packages. Such light emitting device packages, substrate, and optical members may function as a light unit. In accordance with another embodiment, a display apparatus, an indication apparatus or a lighting system may be implemented using the semiconductor light emitting devices or light emitting device packages described in conjunction with the above-described embodiments. The lighting system may include, for example, a lamp or a street lamp.

Hereinafter, a head lamp, and a backlight unit as embodiments of the lighting system including the above-described light emitting devices or light emitting device packages will be described.

Figure 10:
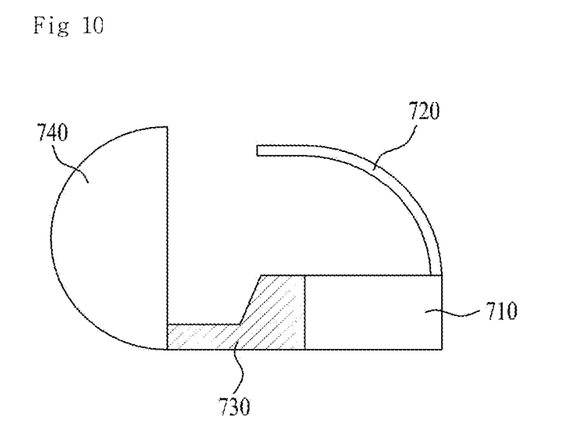
FIG. 10 is a view illustrating a head lamp according to an embodiment, in which a light emitting device or light emitting device package according to one of the above-described embodiments is disposed.

FIG. 10 is a view illustrating a head lamp according to an embodiment, in which a light emitting device or light emitting device package according to one of the above-described embodiments is disposed.

Referring to FIG. 10, light emitted from a light emitting module 710, in which a light emitting device or light emitting device package according to one of the above-described embodiments is disposed, passes through a lens 740 after being reflected by a reflector 720 and a shade 730, so as to be directed forwardly of a vehicle body.

The light emitting module 710 may include a plurality of light emitting devices mounted on a circuit board, although the present disclosure is not limited thereto.

Figure 11:
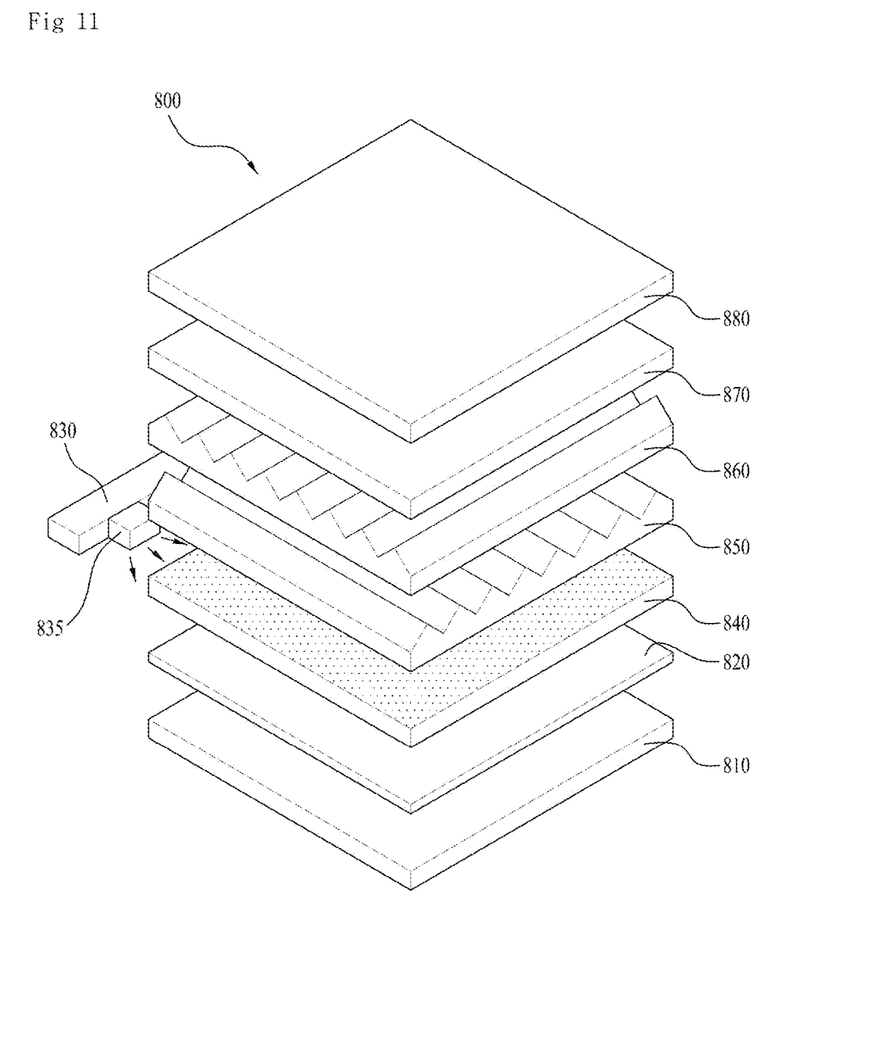
FIG. 11 is a view illustrating a lighting system according to an embodiment in which light emitting device packages according to the above-described embodiment are disposed.

FIG. 11 is a view illustrating a lighting system according to an embodiment in which light emitting device packages according to the above-described embodiment are disposed.

As shown in FIG. 11, the lighting system according to the illustrated embodiment, which is designated by reference numeral "800", includes a light source module 830-835, a reflection plate 820 disposed on a bottom cover 810, a light guide plate 840 disposed in front of the reflection plate 820, to guide light emitted from the light source module 830-835 to a front side of the lighting system 800, an optical sheet including first and second prism sheets 850 and 860 disposed in front of the light guide plate 840, a panel 870 disposed in front of the optical sheet, and a color filter 880 disposed in front of the panel 870.

The light source module 830-835 includes a circuit board 830 and light emitting device packages 835 mounted on the circuit board 830. Here, a printed circuit board (PCB) may be used as the circuit board 830. The light emitting device packages 835 may have the configuration described above in conjunction with FIG. 9.

The bottom cover 810 may receive the constituent elements of the lighting system 800. The reflection plate 820 may be provided as a separate element, as shown in FIG. 11, or may be formed by coating material having high reflectivity over a rear surface of the light guide plate 840 or a front surface of the bottom cover 810.

Here, the reflection plate 820 may be made of a material having high reflectivity and capable of being formed into an ultra thin structure. Polyethylene terephthalate (PET) may be used for the reflection plate 820.

The light guide plate 840 serves to scatter light emitted from the light source module 830-835 so as to uniformly distribute the light throughout all regions of the lighting system. Therefore, the light guide plate 840 may be made of a material having high refractivity and transmissivity. The material of the light guide plate 840 may include polymethylmethacrylate (PMMA), polycarbonate (PC), polyethylene (PE), or the like. The light guide plate 840 may be omitted. In this case, an air guide system, which transfers light in a space over the reflective sheet 820, may be implemented.

The first prism sheet 850 may be formed by coating a polymer exhibiting light transmittance and elasticity over one surface of a base film. The first prism sheet 850 may have a prism layer having a plurality of three-dimensional structures in the form of a repeated pattern. Here, the pattern may be of a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light source module 830-835 and the reflective sheet 820 toward the entire surface of the panel 870.

In this embodiment, the optical sheet may be constituted by the first prism sheet 850 and second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The display panel 870 is configured such that liquid crystals are located between glass bodies, and polarizing plates are mounted on both glass bodies so as to utilize polarizing properties of light. Here, the liquid crystals have properties between a liquid and a solid. That is, the liquid crystals which are organic molecules having fluidity like the liquid, are regularly oriented, and, as such, display an image using change of such molecular orientation due to an external electric field.

The liquid crystal display panel used in the lighting system is of an active matrix type, and uses transistors as switches to adjust a voltage applied to each pixel.

The color filter 880 is provided on the front surface of the panel 870, and transmits only a red, green or blue light component of light projected from the panel 870 per pixel, thereby displaying an image.

In accordance with the above-described embodiments, current spreading up to the mesa etching region may be achieved and, as such, an enhancement in light amount of the light emitting device and an improvement in operating voltage of the light emitting device may be achieved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a light emitting structure comprising a first conductivity type semiconductor layer, a second conductivity type semiconductor layer, and an active layer disposed between the first conductivity type semiconductor layer and the second conductivity type semiconductor layer;
    a first electrode disposed on the first conductivity type semiconductor layer; and
    a second electrode disposed on the second conductivity type semiconductor layer,
    wherein the light emitting structure comprises a mesa etching region where the second conductivity type semiconductor layer, the active layer, and the first conductivity type semiconductor layer are etched, thereby exposing a portion of the first conductivity type semiconductor layer in the mesa etching region, and the first electrode is disposed on the exposed portion of the first conductivity type semiconductor layer in the mesa etching region,
    wherein a first electrode layer is disposed between the second conductivity type semiconductor layer and the second electrode, and a second electrode layer is disposed between portions of the first electrode layer spaced from each other at opposite sides of the mesa etching region, and
    wherein opposite ends of the second electrode layer are disposed directly on the first electrode layer.

2. The light emitting device according to claim 1, wherein each of the first electrode layer and the second electrode layer is a transparent electrode layer.

3. The light emitting device according to claim 1, wherein the second electrode layer has a higher level than the first electrode layer at a location where the second electrode layer contacts the first electrode layer.

4. The light emitting device according to claim 1, wherein the second electrode layer is thicker than the first electrode layer.

5. The light emitting device according to claim 1, wherein the second electrode layer is disposed in the mesa etching region toward an end portion of the second electrode.

6. A lighting apparatus comprising:
    a reflection plate disposed on a bottom cover;
    a light guide plate disposed on the reflection plate;
    an optical sheet disposed on the light guide plate; and
    a light source module including the light emitting device according to claim 1.

7. The light emitting device according to claim 1, wherein an insulating layer is disposed between the mesa etching region and the second electrode layer.

8. The light emitting device according to claim 7, wherein the insulating layer encloses the first electrode.

9. The light emitting device according to claim 7, wherein the insulating layer is disposed inside a portion of the light emitting structure exposed through the mesa etching region.

10. The light emitting device according to claim 9, wherein an empty space is present between the second electrode layer and the first electrode.

* * * * *